United States Patent [19]
Dubois

[11] 3,893,150
[45] July 1, 1975

[54] SEMICONDUCTOR DEVICE HAVING AN ELECTROLUMINESCENT DIODE

[75] Inventor: Jean-Claude Dubois, Caen, France

[73] Assignee: U.S. Philips Corporation, New York, N.Y.

[22] Filed: June 12, 1974

[21] Appl. No.: 478,610

Related U.S. Application Data

[63] Continuation of Ser. No. 246,139, April 21, 1972, abandoned.

[30] Foreign Application Priority Data

Apr. 22, 1971 France .............................. 71.14388

[52] U.S. Cl. ...................... 357/17; 357/18; 357/30; 357/68
[51] Int. Cl. ............................................ H01l 15/00
[58] Field of Search .................... 357/17, 18, 30, 68

[56] References Cited

UNITED STATES PATENTS

| | | | |
|---|---|---|---|
| 3,302,076 | 1/1967 | Kang | 357/53 |
| 3,405,329 | 10/1968 | Lord | 357/53 |
| 3,446,995 | 5/1969 | Castrucci | 307/304 |
| 3,501,679 | 3/1970 | Yonezu | 357/17 |
| 3,529,217 | 9/1970 | Van Lanten | 357/30 |
| 3,675,091 | 7/1972 | Nomoto | 357/53 |
| 3,688,166 | 8/1972 | Desvignes | 357/32 |

*Primary Examiner*—Martin M. Edlow
*Attorney, Agent, or Firm*—Frank R. Trifari; Leon Nigohosian

[57] ABSTRACT

A device having an electroluminescent junction constituted in a flat semiconductor substrate.

The device is characterized in that the emissive surface of the junction is partially occulted by a deposit of a material which is opaque to the radiations emitted by said junction.

Application to electroluminescent devices used in telemetry.

6 Claims, 11 Drawing Figures

SEMICONDUCTOR DEVICE HAVING AN ELECTROLUMINESCENT DIODE

This is a continuation, of application Ser. No. 246,139, filed Apr. 21, 1972 now abandoned.

The present invention relates to a semiconductor device comprising at least one electroluminescent junction formed by a region diffused in a flat substrate, which region is provided at its surface with contact elements of which at least one forms a ring extending at the periphery of the said region.

It is known to modulate the light wave emitted by an electroluminescent diode in the frequency of an excitation current of a given frequency. This mode of functioning of an electroluminescent diode has already been used advantageously for various applications, for example in telemetry.

It is also known that the phase of the modulation wave (introduced by the alternating excitation current) in the light emitted by an electroluminescent junction varies between the various points of the surface of said junction. The systematic exploration of the emitted light shows that the phase difference is maximum between the peripheral zone and the central zone of the said junction and that between said extreme zones the phase variation is substantially regular. The peripheral zone adjoining the electric contacts, however, appears as being the most disturbed part.

Although no rigorous explanation of this phenomenon can be put forward, it appears that the phase shift is related to the different values of the time constant RC distributed from each contact in the direction of each emissive point of the junction.

The lack of homogeneity of the phase of the modulation wave superimposed upon the light wave in diodes used in high frequency excitation, which characterizes the electroluminescent diodes of the various types known up to now, constitutes a non-negligible defect for certain applications.

In the above-mentioned telemetry application, the electroluminescent diode is placed in the proximity of the focus of an optical system so as to produce a light beam which is sent in the direction of a target. The beam reflected by the target in the direction of the transmitter is focused on a photodiode and, by measuring the phase shift between the transmission and the reception, the distance between the assembly transmitter-receiver and the target is determined.

The lack of homogeneity of the phase of the modulation in the light emission of the diode at high frequency can be expressed by an error of at least 0.20 m over a distance measured of the order of a thousand metres. The importance of this error varies according to the region of the image of the source provided by the reflected light beam, in which the receiving photodiode is placed.

In order to mitigate the defect of the diode which produces the measuring error, it has been proposed to provide the electroluminescent junction with an optical system which is complicated and the function of which is mixing the light waves delivered by each elementary surface of the junction. The overall light obtained, complex though it is, offers phase-wise at least the advantage of being uniform and of permitting telemetric measurements which are considerably less erroneous but it is difficult to achieve a suitable optical system and to adjust the optical system on the diode.

The object of the present invention is the realization of an electroluminescent diode adapted to produce a modulated light wave whose modulation phase is more equal between one point and a point at the junction which generates the wave.

The invention is based on the consideration that, when the peripheral zone of an electroluminescent junction, which zone is near the electric contacts is the part of the junction where the rate of variation of the modulation phase appears to be highest, it is desirable to construct the electroluminescent device constructed to eliminate this "edge effect."

According to the invention, a semiconductor device comprises at least one electroluminescent junction constituted by a region diffused in a flat substrate, contact elements at the surface of the region, of which at least one forms a ring extending at the periphery of the said region, and a deposit of a material opaque to light radiations emitted by the said junctions, located over a portion of and along the ring.

Advantageously, the contact element in the form of a ring includes an opaque conductor deposit which extends toward the central part of the surface of the region and which is located on a layer of a dielectric material at least partially covering the surface.

Advantageously, the opaque conductor deposit extends at least five microns from the contact element and, preferably, more than twenty microns.

Experience shows that only shutting off the peripheral zone of the junction permits reducing the extreme variation of the phase difference in the proportion of 3 to 1, which is a significant advantage of the device according to the invention.

Such shutting off, or covering, brings a correlative decrease of the light flux emitted by the junction. It is to be noted, however, that in a number of electroluminescent device applications including telemetry, the value of the luminance or intensity of the light radiation per unit of emissive surface, is of greater importance than that of the luminous flux.

Actually, in the case of a telemetric measurement, the luminous flux F reaching the optical system at the receiver end is proportional to the luminance L of the source and to the geometric dimensions G, the latter being defined by the formula:

$$G = S_1 S_2 / d^2,$$

in which:

$S_1$ and $S_2$ represent, respectively, the surfaces of the optical systems of transmission and reception and $d$ is the light path which separates said two optical systems.

For a given value of the term G, the flux F thus depends only on the luminance L of the source. The luminance L is proportional to the ratio $P/S_e$ of the total candle power P emitted by the source - in the circumstances, the electroluminescent diode - at the overall surface $S_e$ of the emissive junction of said diode and, for a chosen power P, the ratio $P/S_e$ is constant.

A second advantage of the invention is its simplicity of manufacture. The method of manufacturing an electroluminescent diode in which parts of the surface of the junction are covered by a conductor deposit differs little, actually, from that of a normal electroluminescent diode. It is necessary only, after the diffusion operation for providing the emissive junction, to cover the whole or part of the surface of the junction, as the case may be, with a layer of dielectric material, which layer is necessary to insulate the covering conductor deposit from the said junction.

According to a preferred embodiment of the invention, the peripheral ring forming the electric contact on the surface of the diffused region includes at least one contact strip, which extends from the ring towards the central part of the region.

The contact strip which is connected to the peripheral ring thus is inset, on a fraction of its length, in the opaque deposit which partially covers the region.

Such an arrangement reduces the extend of the phase shift between the light emitted by the peripheral parts of the diode and the light emitted by central parts of the diode. If it is considered that the modulation of the peripheral light is at the "minimum" of the phase and that of the central light at the "maximum", the zero being situated substantially at equal distance from said two regions, experience shows that by extending the outer contact ring by a strip directed towards the central part of the region, the "maximum" is considerably attenuated and, consequently, by extent of the area of phase shift reduced.

In this form of structure, the best results have been obtained by applicants with a diode having a circular junction comprising, besides the peripheral contact ring, four radially directed contact strips shifted angularly by $\pi/2$, but insulated from each other at their extremity opposite to the ringe, an opaque conductor deposit covering in all cases a surface of the region according to the desired level light quality.

With an electroluminescent diode thus formed it has been possible to reduce by 10 to 15 times the extent of the difference in phase on the modulation and to reduce thus in the same proportion the error committed in a telemetric measurement.

The variation of the phase shift is weaker as the uncovered surface of the emissive region is narrower. Nevertheless, for purposes of telemetry, there is a minimum surface below which it is not possible to work, for it would become difficult and dangerous to rapidly place the optical system at the telemeter receiver end in the surface of the image provided by the optical system at the telemeter transmitter end, which image is then too small.

The basic principle according to the invention, of realizing an electroluminescent diode of which a part of the emissive surface is covered to reduce the extent of phase shift between the modulations at high frequency of the elementary pencils of light constituting the total beam supplied by the diodes, is also applicable to electroluminescent devices having a large emissive surface capable of delivering a high luminous flux.

According to an advantageous emobidment of the invention, applicable to diodes having a large emissive surface, the net of the contact elements comprises, besides the peripheral ring and at least one contact strip extending from the ring towards the central part of the diffused region, at least one intermediate ring disposed on the central part of the region situated between the central and peripheral parts of the region.

Preferably, the intermediate ring is homothetic with the peripheral ring; in the case of a region having a circular surface, this results in concentric contact rings.

Such a geometry of the contact elements, completed by an opaque conductor deposit, extending on a layer of a dielectric material and from the peripheral contact ring in the direction of the intermediate ring (or where several of said rings have been provided on the surface of the region from the nearest of the intermediate rings), permits reducing in a proportion reaching 6 to 1, the extreme variation of the phase difference on the modulation of the light emitted by an electroluminescent diode having a large emissive surface. This result is obtained due, on the one hand, to the opaque conductor deposit which covers the peripheral emissive zone, which zone is particularly troublesome as has already been seen above, and due, on the other hand, to the intermediate rings which introduce a "delay in growth" of the phase shift.

The telemetric measurement error resulting from an electroluminescent diode having a large emissive surface that corresponds to the uncovered part of the junction but constructed according to the invention described above, thus is also six times less than that with a conventional diode having an emissive surface which is substantially equivalent.

In order to realize a semiconductor device having an electroluminescent junction according to the invention, a film of dielectric material is deposited on the surface of the substrate or of the epitaxial layer generally deposited on the substrate and subsequently selectively etching the dielectric film to open a window through which the diffusion of a suitable material may then be effected to form a junction. A second film of the dielectric material is then provided to cover at least the surface of the region previously diffused; in practice it is easier to deposit a second film which covers both the diffused region and the remaining part of the first dielectric film. In the second dielectric film present only above the diffused region and which constitutes in said region of the device what has previously been designated by the expression "layer of a dielectric material," contact windows are opened by etching. A deposit of a thin layer of a conductive material is then provided and, by selectively removing the thin layer, the contact elements and the opaque conductor deposit covering the peripheral part of the surface of the diffused region.

The parts of the second film of the dielectric material which cover the areas of the region not covered by the contact elements or the opaque conductor deposit may either be removed or maintained, in accordance with the methods of using the electroluminescent device. In the second case, it is obvious that the dielectric material used must be transparent to the radiation emitted by the junction.

On the other hand, the structure of the device may employ a suitable optical system (for example, in the form of a hemisphere or a plane convex meniscus) if that should be necessary in various applications.

The nature of the system or of the initial epitaxial layer, the nature of the material used for the diffusion, that of the material or materials of the dielectric films and that of the material of the thin conductor layer of the contact elements and of the opaque conductor deposit are of no critical importance with respect to the invention.

For example, the invention may be applied to electroluminescent devices manufactured from semiconductor crystals of direct band-gap material such as gallium arsenide, gallium antimonide, indium phosphide, and so on. Advantageously, the crystal is of *n*-conductivity type and the diffusion impurity is zinc; the material constituting the dielectric films is silicon nitride or silicon dioxide; the conductive material of the contact elements and of the opaque conductor deposit is aluminum.

The invention also relates to a telemetric device comprising a semiconductor device according to the invention.

From the following description with reference to the accompanying drawings, given by way of a non-limiting example, it will be well understood how the invention can be realized.

Figure 1:
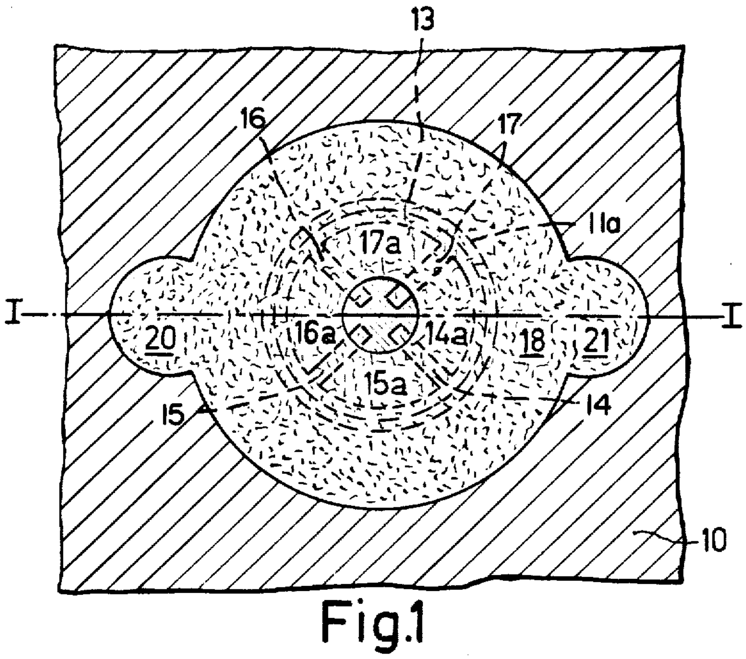
FIG. 1 is a plan view of a semiconductor diode having an electroluminescent junction in an embodiment according to the present invention.

FIGS. 3*a* to 3*g* correspond to the main stages of the manufacture of the electroluminescent diode of FIG. 1.

Figure 4:
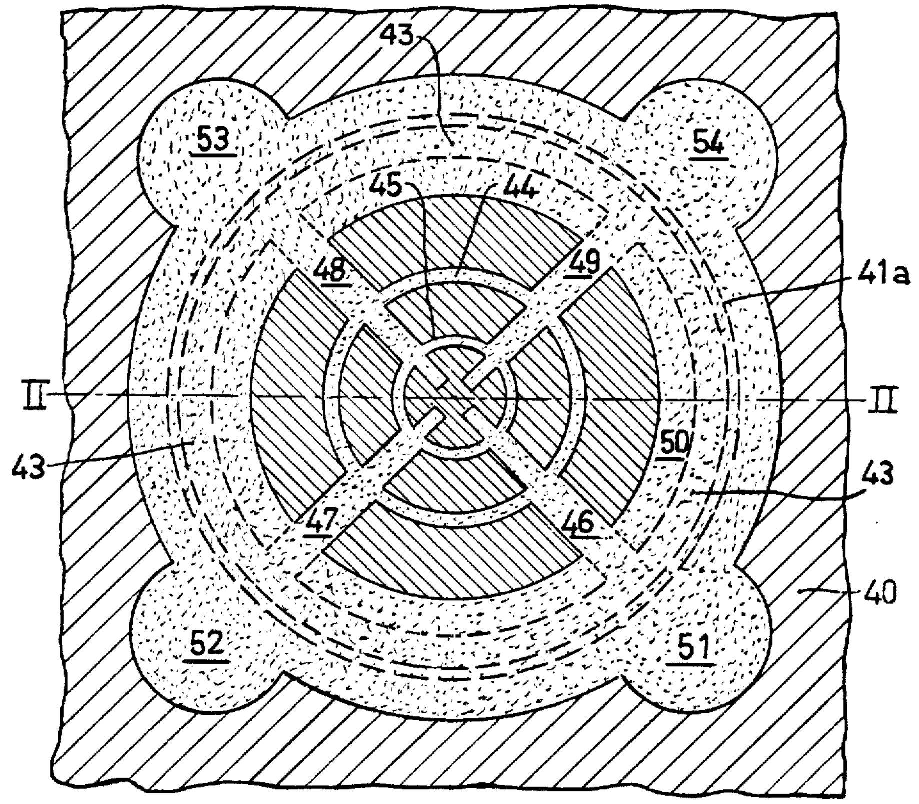

FIG. 4 is a plane view of a semiconductor diode having an electroluminescent junction in accordance with the invention in another embodiment.

Figure 5:
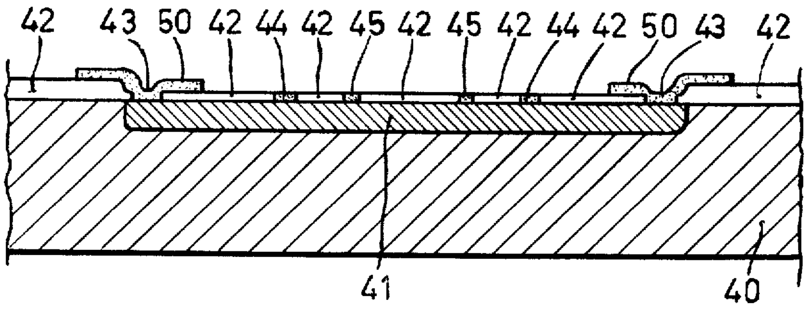

FIG. 5 also shows the diode of FIG. 4 taken in a cross-section on the line II—II of FIG. 4.

The structure of the electroluminescent diode shown in FIG. 1 corresponds rather, in the spirit of the invention, to the diodes having a small emissive surface with which the extreme phase variation between the modulations of the elementary light emitted by each elementary point of the uncovered junction is minimum.

This diode (FIG. 1) can be manufactured in a conventional manner on a crystalline support or a epitaxial layer 10.

The emissive junction is formed at the level of the diffused region 11 of which the contour, in this case circular is shown in FIG. 1 by the long broken line 11*a*.

Figure 2:
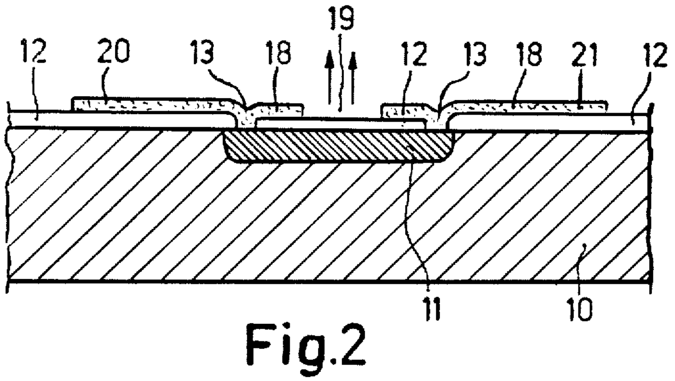
FIG. 2 is a cross-sectional view of the same diode according to a cross-section taken on line I of FIG. 1.

The surface of the substrate 10 and a significant part of the area of the region 11 are covered with a layer of a transparent dielectric material 12 (FIG. 2).

Electric contacts are provided on the region 11 through the dielectric layer 12.

In a preferred embodiment shown in FIG. 1, the contact consist of a closed ring 13 disposed on the periphery of the region 11, slightly on the inner side of the limit 11*a* of the latter and four, for example, contact strips 14, 15, 16 and 17 provided on respective angular distances substantially equal to $\pi/2$ extending from the ring 13 in the direction of the central region of the region 11.

An opaque conductor deposit 18, covers a considerable part of the region 11 and extends substantially beyond the limit 11*a* of the region island. The conductor deposit 18 is insulated from the region 11 and from the substrate 10 by the dielectric layer 12, except in the places of the contacts 13 (to which contact 13 it is connected over the entire length of the contact) and 14, 15, 16, 17 of which parts 14*a*, 15*a*, 16*a* and 17*a* emerge from the layer above the central part of the region 11.

The conductor deposit 18 forms a screen against the light emitted by the parts of the junction below it and notably by the peripheral parts of said junction.

So the junction can only emit substantially through the window. Experience shows that in the case where said junction is excited by a current of high frequency, the high frequency modulation superimposed upon the carrier light wave is substantially of equal phase all over the surface corresponding to the window 19.

The conductive surfaces 20 and 21 which extend to the periphery of the conductor deposit 18 are designed to facilitate the provision of electric contact wires by thermo-compression.

In order to realize a structure such as is shown in FIG. 1, there should be operated in the following manner (see FIGS. 3*a* to 3*g*).

Figure 3A:
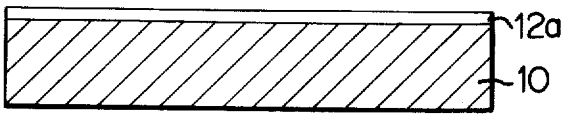

On the effective surface of a substrate 10 (crystal or epitaxial layer as has been described above) is deposited a first layer 12*a* (0.1 to 0.5 micrometer) of a dielectric material (see FIG. 3*a*).

For example, the substrate is of gallium arsenide and the dielectric material is of silicon dioxide or of silicon nitride. The silicon nitride is preferably used owing to its better properties as a masking material during the diffusion.

The layer 12*a* of silicon nitride is formed on the substrate 10 by using known methods. For example, the substrate is exposed to a mixture of vapours of ammonia and silane ($SiH_4$) diluted in hydrogen at a temperature lying between 700° and 900°C.

Figure 3B:
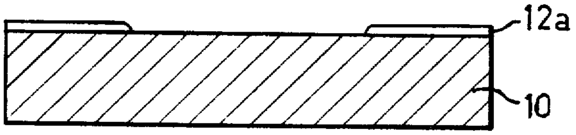
Figure 3C:
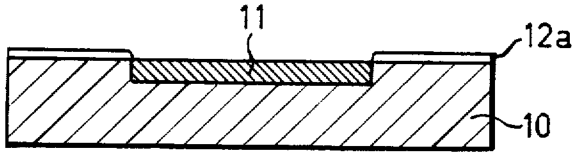
Figure 3D:
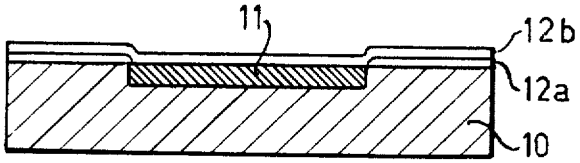

A window 30 is then made in the layer 12*a* by masking by means of a photosensitive lacquer and etching the nonprotected silicon nitride with a warm solution of dilute ortho-phosphoric acid (see FIG. 3*b*).

The following phase (see FIG. 3*c*) is that of the diffusion of an impurity, by any of the classical diffusion methods, so as to create the region 11 and a luminescent pn junction. It is known that the formation of an emissive junction is ordinarily obtained by diffusion of an impurity of the p-type in a crystal of the n-type. For a substrate 10, for example of n-type, the diffused island 11 of the p-type is advantageously formed by diffusion of zinc.

The region 11 being formed, a second layer 12*b* of silicon nitride (see FIG. 3*d*) is deposited. Said layer 12*b* (of a thickness of from 0.1 to 0.5 micrometer, as the layer 12*a*) covers only and directly the surface of the region 11, while it increases the thickness of the dielectric on the regions of the outer structure of the said region 11.

Figure 3E:
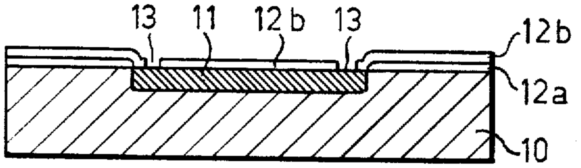

Apertures are then made in the thickness of the layer 12*b* in a manner such as to determined contact surfaces on the region 11. In accordance with FIG. 1, said apertures visible on the cross-section of FIG. 3*e*, are those of the peripheral contact ring 13.

Figure 3F:
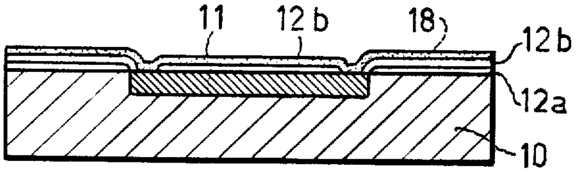

A conductor coating 18 is then deposited on the assembly of the effective surface of the structure, for example by evaporation in a vacuum (see FIG. 3*f*). Said coating 18, thickness of, e.g., 1 to 3 microns usually is of aluminum.

Figure 3G:
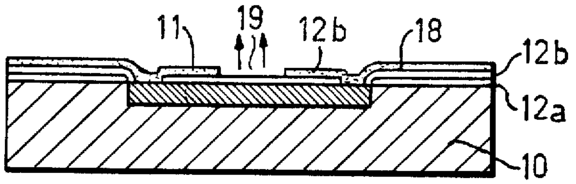

Finally, the window is opened by photoengraving the coating 18 through which window the light emission is effected (see FIG. 3*g*).

In known manner, the supporting crystal is etched on its rear surface opposite the junction, to eliminate any part contaminated by the zinc during the diffusion and to then deposit on the etched surface a conductive layer (for example tin or gold-germanium) so as to form the second electric contact terminal of the device.

To produce an electroluminescent diode having a very small variation of phase shifts in the emitted light modulation, which diode can be used notably for telemetric precision measurements (e.g., precision in the order of the centimeter over a distance of a thousand meters), the outer diameter of the region 11 is, e.g., from 165 to 185 microns, that of the window 19 is, e.g., from 50 to 70 microns, while the peripheral contact ring 13 has an average diameter of e.g., 150 microns and a width of e.g., from 15 to 20 microns and the contact strips 14, 15, 16 and 17 have a width, e.g., from 7 to 13 microns extending from 10 to 15 microns on the surface of the window 19.

All these Figures are given by way of example as a result of observations and experiences realized by the applicants. It does by no mean constitute a restriction of the field of application of the present invention.

The structure of the electroluminescent diode shown in FIG. 4 and shown in a cross-section in FIG. 5 is an example of application of the invention to the manufacture of a device of comparatively large emissive surface compared to that of the device of FIG. 1.

The crystalline support or the epitaxial layer is denoted by 40.

The diffused region 41 in which the emissive junction is localized (see FIG. 5) is shown in FIG. 4 by its contour 41*a*, in this case circular also, shown in long broken lines.

The layer of a transparent dielectric material which covers the surface of the island 41 and the remainder of the surface of the substrate 40 is denoted by 42 (see FIG. 5).

The junction covering a compartively large surface, a series of contact zones have been created at the surface of the region 41, which contact zones comprise a peripheral ring 43, two intermediate rings 44 and 45 concentric with the ring 43 and contact strips 46, 47, 48 and 49. The latter are disposed regularly on the surface on adjacent angular distances of $\pi/2$ and their width decreases in the direction from the periphery towards the center of the region 41. The rings 44 and 45 cross the strips 46, 47, 48 and 49 on their circular course.

The assembly generally is symmetric and divides the emissive surface into sectors.

With the object of reducing the phase dispersion and in accordance with the invention, the peripheral zone of the region island 41 is covered or shielded by a conductive opaque coating 50 that is connected to the different contact deposits (coating and contact can be formed during the same operation) and that is separated from the region 41 and from the substrate 40 (except at the regions of the contacts) by the dielectric layer 42. The coating 50 extends beyond the limits of the region 41 above the substrate 40 and is elongated at 51, 52, 53, 54, so as to constitute areas which are sufficiently extended for soldering outer connection wires.

It is obvious that the devices shown in FIGS. 1 and 4 have similar basic ideas. The largest emissive surface of the diode of FIG. 4 with respect to that of FIG. 1 has only resulted in an increase in the number and the area of the contacts so as to take advantage of the decrease of phase on the modulation of the light emitted from the periphery to the center of the junction which is produced at the level of each of the contacts.

By way of example and in order to permit a comparison between the devices of FIGS. 1 and 4, the outer diameter of the region 41 is, e.g., between 450 and 490 microns, the inner diameter of the opaque conductor coating 50 which limits the part of the junction which is left active is preferably between 310 and 350 microns, while the peripheral contact ring 43 and the intermediate rings 44 and 45 placed on circumferences of respective average diameters of, e.g., 420, 200 and 90 microns and have widths varying from 40 to 50 microns for the ring 43 and from 15 to 25 microns for the rings 44 and 45. The width of the contact strips 46, 47, 48 and 49 is, e.g., from 7 to 36 microns and the extremities of the strips are at a distance from 20 to 30 microns from the axis of the structure.

Each of the described embodiments of the invention (FIGS. 1 and 4) corresponds to a structure of circular geometry. However, such a geometry is not necessary.

The number, the form and the mode of distribution of the rings and contact strips also are not unalterably fixed but determined, in each case, in accordance with experimental observations. Moreover it is not necessary for the contact rings to be closed in themselves.

Finally, the elements of the dielectric layer 12 (FIG. 2) of 42 (FIG. 5) are not required to be at right angles to those areas of the region 11 (FIG. 2) or 41 (FIG. 5) that are not covered by the opaque conductor deposit, but may be removed by the usual technique of photoengraving.

What is claimed is:

1. A semiconductor device comprising:

a. a substantially flat semiconductor substrate having a first conductivity type and comprising a first surface;

b. at least one diffused region located at said first surface of said substrate and having a second conductivity type so as to form an electroluminescent junction with said substrate and means for energizing said junction;

c. a dielectric material layer covering at least a portion of said substrate surface and including an opening extending therethrough, said surface portion comprising at least a part of said diffused region surface and said dielectric layer being transparent at those parts thereof disposed at said diffused region surface; and d. contact elements provided at said diffused region surface, at least a first one of said contact elements comprising a first portion having a ring configuration and extending through said layer opening to said diffused region surface and extending along the periphery of said region, said first contact element consisting essentially of a conductive material, said first contact element further comprising a second portion comprising a layer of material that is opaque to light radiation emitted by said junction and that is disposed at the inside of and along said first portion, said opaque layer being at least partly located on a portion of said dielectric layer disposed above said diffused region and extending toward the central part of said diffused region surface.

2. A telemetric device comprising a semiconductor device as recited in claim 1.

3. A semiconductor device as claimed in claim 1, wherein said opaque layer extends by at least five mircons toward said central part of said diffused region surface.

4. A semiconductor device as recited in claim 1, further comprising a plurality of contact strips independent of each other and connected to said first portion of said first contact element, said strips being disposed on said diffused regions surface and extending in the direction of the central part of said diffused region.

5. A semiconductor device as recited in claim 4, wherein intermediate portions of said contact strips are interconnected by at least one further ring contact element.

6. A semiconductor device as recited in claim 5, wherein said further ring contact element extends over part of said diffused region and is parallel to said first contact element.

* * * * *